United States Patent [19]

Woodhead

[11] Patent Number: 4,771,245
[45] Date of Patent: Sep. 13, 1988

[54] EARTH TESTING MEANS FOR AN ELECTRIC FENCE NETWORK

[75] Inventor: Ian M. Woodhead, Christchurch, New Zealand

[73] Assignee: Development Finance Corporation, New Zealand

[21] Appl. No.: 905,403

[22] Filed: Sep. 10, 1986

[51] Int. Cl.$^4$ .......................................... G01R 31/02
[52] U.S. Cl. .................................. 324/510; 340/649
[58] Field of Search ............... 324/72.5, 72, 133, 509, 324/510, 522, 555; 340/661, 564, 649; 256/10

[56] References Cited

U.S. PATENT DOCUMENTS

| 2,450,153 | 9/1948 | Moore | 324/72 |
| 3,581,299 | 5/1971 | Schmit | 256/10 |
| 4,297,633 | 10/1981 | McCutchan et al. | 324/51 |

Primary Examiner—Reinhard J. Eisenzopf
Assistant Examiner—Anthony L. Miele
Attorney, Agent, or Firm—Holman & Stern

[57] ABSTRACT

An earth testing means for monitoring the status of the earth return system of an electric fence network is arranged to indicate the potential difference between the earth return system of the electric fence and a secure earth. In one embodiment the earth testing means comprises an indicator to provide a quantitive display of the fence earth-secure earth potential difference.

11 Claims, 2 Drawing Sheets

EARTH TESTING MEANS FOR AN ELECTRIC FENCE NETWORK

The present invention relates to an earth testing means for an electric network. An electric fence network generally comprises a fence line or a number of fence lines, an electrical energiser or controller, and an earth return system. The fence line comprises an uninsulated electrical conductor which is electrified by the energiser which is connected both to a source of electrical power, usually the 230 v mains supply, and to the proximal end of the fence line, and which acts to convert the continuous alternating mains voltage to a pulsed direct current voltage. The energiser is coupled to the fence line conductor and the earth return is generally effected through the ground (although systems in which earthing is effected by way of a return conductor are not unknown).

The simplified impedence network of the fence circuit comprises a first series impedance component (herein $Z_L$) representing the impedance of the live wire leadout, a second shunt impedance component (herein $Z_F$) representing the shunt impedance from fence to ground, and a third series impedance component (herein $Z_E$) representing the impedance of the earth return. The impedances $Z_L$ and $Z_E$ should desirably be very small in relation to the fence shunt impedance $Z_F$ so that a maximum voltage appears across $Z_F$ i.e.: across the fence, with minimal voltage being lost across either the leadout impedance $Z_L$ or the earth impedance $Z_E$. Of these two components the latter, $Z_E$, is by far the most likely to increase due to a defect arising in the earthing system or the like.

The earth impedance component itself comprises two series components: the soil impedence ie: the impedance of the soil through which the earth return is effected, and the conductor impedance ie: the impedance of the earth conductor which makes electrical contact with the soil adjacent or in the region of the energiser. This earth conductor generally consists of a number of metal posts, implanted in the soil to effect an electrical contact therewith. The posts are electrically connected together with wire, such as fencing wire, and are also connected to the energiser. The best ie: least impedance earth is obtained if the posts are implanted in a damp area of ground and they are thus often sited away from the energiser. Nonetheless earth connections of this type, which are the most common, are particularly susceptible to becoming defective and it is accordingly important that the earth is tested regularly to ensure that the electric fence is operating correctly. If, for example, the earth connection, or some other part of the earth system, becomes defective so that its impedance is increased, a proportion of the electrical voltage supplied by the fence energiser will be dissipated across the earth system so that in use, when an animal completes the circuit between the ground and the fence, a lesser proportion of the energiser voltage will be dissipated across the animal which will accordingly receive a lessened electrical shock. If the earth system becomes seriously defective the fence may be rendered completely inoperative and this can allow livestock to stray. Faults can occur due to changes in weather and soil conditions, vegetation contacting the fence line, alterations in the fence network geometry in networks comprising a number of separate fence line, degradation of components with time, and so forth.

The usual method of testing an electric fence earth is to place a temporary "short" on the fence, from fence to ground, and to simultaneously manually touch the fence line and the ground. If a shock is felt the earth is deemed inadequate because this indicates that the fence line is set at a higher than earth potential notwithstanding the presence of the short. The short generally consists of a few iron standards placed against the fence. This method of testing is largely inadequate and moreover requires that the tester remember to perform the test regularly. The test relies on the detection of an earth voltage to indicate a defective earth and as this is done by touch, detection is unreliable. There is also a tendancy for the tester to regard a single successful test as an adequate indication that the earth system is performing satisfactorily and will continue to do so for the life of the network.

Accordingly, the present invention proposes an earth testing means for monitoring status of the earth return system of an electric fence network wherein the earth testing means is arranged to compare the potential difference between the said earth return system of the electric fence and a secure earth.

Preferably the earth testing means includes an indicator to provide a quantitive display of the fence earth-secure earth potential difference, and this indicator could suitably be a differential input voltage indicator.

It is envisaged that the earth testing means would most suitably be incorporated into an electric fence and energiser with one input to the indicator connected to a fence earth terminal of the energiser and another input to the said indicator connected to a secure earth input to the energiser.

By "secure earth" is meant, for example, the earth or neutral line of the mains supply or the like, or any other earth which is known to not be subject to fluctuations of earth security and so forth.

The earth testing means of the invention will be further described with reference to the accompanying drawings in which:

Figure 1:
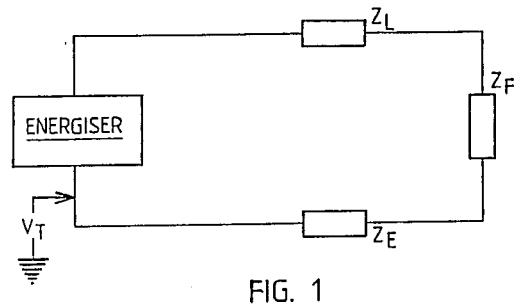
FIG. 1: shows the theoretical impedance network of electric fence.

DETAILED DESCRIPTION OF THE PREFERRED EMBODIMENT:

FIG. 1 in the drawings shows the theoretical impedance network of an electric fence. The network comprises series leadout and earth return impedances $Z_L$ and $Z_E$ and shunt fence impedance $Z_F$ as referred to earlier. Under normal circumstances $Z_L$ and $Z_E$ would be low and $Z_F$ higher so that substantially all the output voltage of the energiser would be dissipated across $Z_F$. When an animal, standing on the ground and thereby making an earth connection, touches the fence it effectively short circuits the fence impedance $Z_F$ so that it then comprises the major impedance component of the fence network, and substantially all the energiser voltage will appear across it. Accordingly the animal will receive an electric shock.

However, if the value of the earth impedance $Z_E$ is substantially increased, for example, if the earth system becomes defective as referred to earlier, when an animal touches the fence and short circuits impedance $Z_F$ a substantial proportion of the available voltage will nonetheless be dissipated across the earth impedance $Z_E$ so that the animal will receive a small shock. In the worst case condition, when the impedance of the defective earth becomes very large, the animal will receive little, if any shock at all.

In accordance with the invention, a test voltage $V_T$ is measured between the earth return terminal of the fence energiser and a secure earth such as the earth or a neutral line of the 230V mains supply as shown. In theory the fence and mains earths should be at the same potential so that there will be no potential difference or voltage dissipated between them. In practice, however, due to impedances that inevitably arise in ground earth return systems, there will be a potential difference between the two respective earths. The earth testing means of the invention is arranged to monitor the test potential difference $V_T$ so that if it becomes higher than a predetermined level, this can be detected indicating that the fence earth return system has become defective.

Figure 2:
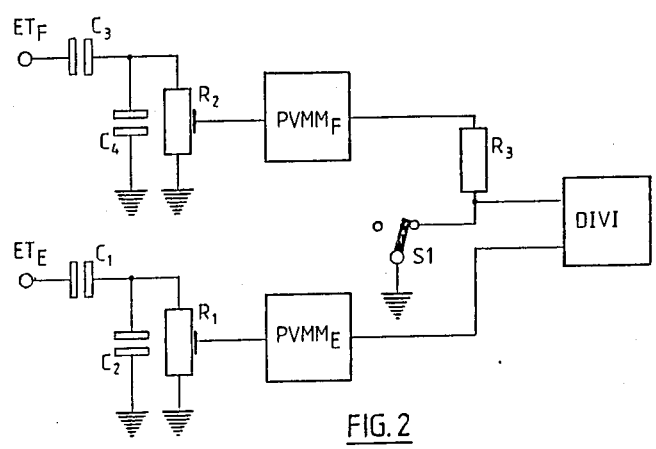
FIG. 2: shows a schematic circuit of the preferred form of earth testing means.

FIG. 2 in the drawings shows a schematic circuit of the preferred form earth testing means which, as earlier stated, is most suitably incorporated into an otherwise conventional electric fence energiser (the earth testing means could however comprises a separate portable unit if desired). The earth input stage of the tester, comprising isolation capacitors $C_1$ and $C_2$ and calibration resistor $R_1$ is connected to the earth terminal $ET_E$ of the energiser and the tester incorporates a differential input voltage indicator DIVI as shown, which includes an appropriate display such as a digital display, LED bargraph display or series of LED indicators or the like (or the "display" could even comprise a hard copy printer) so that a quantitive display of the potential difference between the fence earth and a secure mains earth, also provided to the indicator DIVI through switch S1, will be displayed. Most suitably the tester is incorporated into an energiser with the display incorporated into an energiser with the display incorporated in the energiser casing so that the status of the fence earth can be easily ascertained.

As referred to earlier, the voltage passed through the electrified fence line by the energiser is a pulsed voltage so that any voltage appearing across the earth system will also appear as pulses. Accordingly the preferred form tester includes a peak voltage monitoring means $PVMM_E$ to monitor fluctuations in the fence earth, secure earth potential difference and to record increases in the peak level thereof. This includes appropriate sample and hold of equivalent circuitry whereby the worst case level of the test voltage $V_T$ will be recorded, and continually updated. Thus, in the preferred form monitor, the worst case test voltage will always be displayed or will be available for display by the indicator DIVI, which would otherwise indicate earth fluctuations as they occur, and would indicate same only for the duration of each voltage pulse.

The preferred form tester is switchable to enable the potential difference between the energiser output terminals to be measured. It incorporates in this regard a fence input stage comprising isolation capacitors $C_3$ and $C_4$ and calibration resistor $R_2$ connected to the fence terminal $ET_F$ of the energiser. This fence input stage is swtichably connectable to the differential input indicator DIVI through switch S1 as shown. When the earth status is desired to be monitored, the swtich S1 moved to the position shown in FIG. 2 so that the fence voltage will be short circuited to the secure earth through a resistor $R_3$ and so that the secure earth will be supplied to the input of the indicator DIVI for comparison with the fence earth. When the fence voltage is desired to be monitored, the switch S1 is moved to its alternative position, shown in phantom outline, so that the secure earth will no longer be supplied to the indicator and will no longer short circuit the fence voltage, and so that the fence voltage will be supplied to the input of the indicator for comparision with the fence earth whereby the indicator DIVI will display the available fence voltage. Again, a peak voltage indicator $PVMM_F$ is included in the fence voltage input stage.

Figure 3:
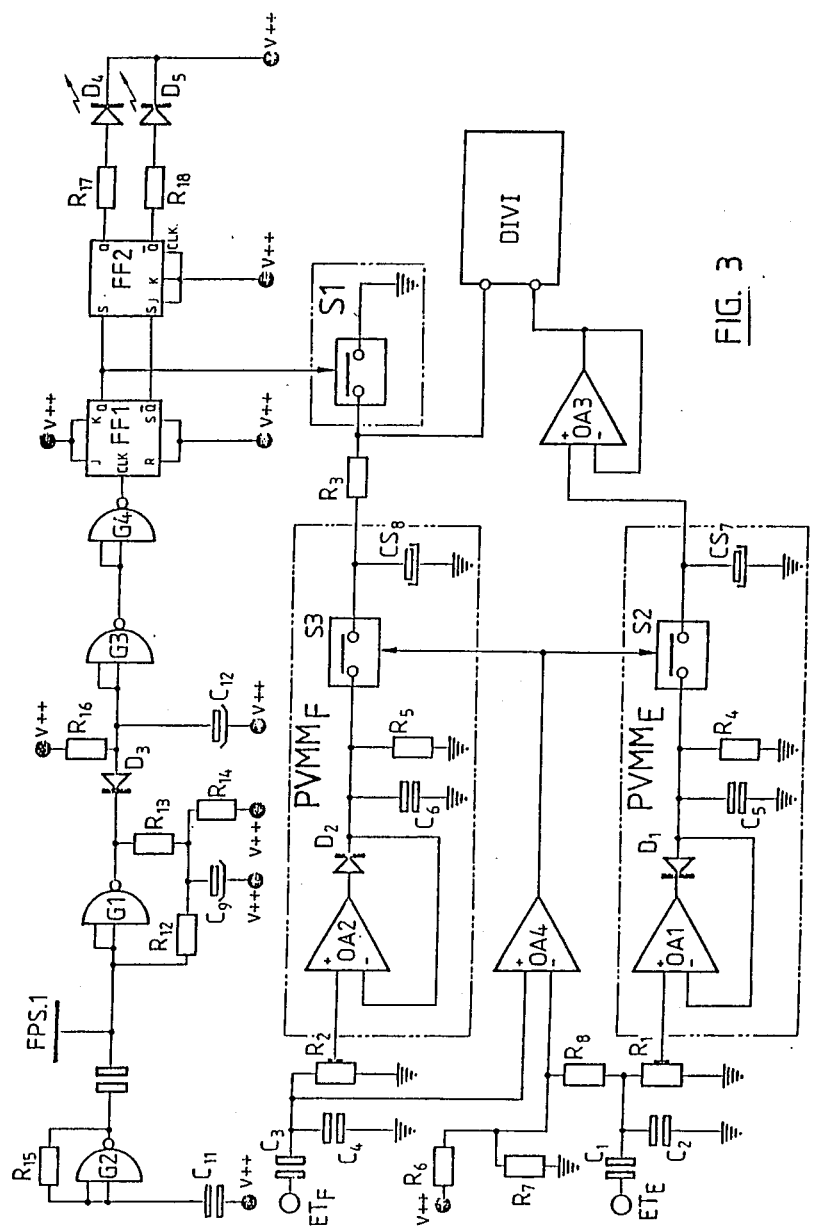
FIG. 3: shows an actual circuit for the preferred form of earth testing means.

FIG. 3 shows an actual circuit for the preferred form earth testing means. The earth and fence input stages comprising capacitors $C_{1-4}$ and resistors $R_1$ and $R_2$ are configured as in FIG. 2. The earth and fence peak voltage monitoring means $PVMM_E$ and $PVMM_F$ as indicated comprise the various components surrounded by broken lines as shown, as is the switch S1. The indicator DIVI is shown as before.

The earth and fence peak voltage monitoring means $PVMM_E$ and $PVMM_E$ comprise input opamps OA1 and OA2 and diodes D1 and D2 configured as shown, such that only positive and negative input pulses can pass respectively. Capacitors and Resistors $C_5$ and $R_4$, and $C_6$ and $R_5$ respectively, which each form a CR network are also provided, and the time constants of these networks are such that some degree of smoothing of consecutive pulses is achieved while the input stages are still able to be rapidly updated when significant variations in the level of input pulses occur. Input pulses are switched through electronic switches S2 and S3 to storage capacitors $CS_7$ and $CS_8$ which act to store the peak levels thereof. The charge stored on the capacitors $CS_7$ and $CS_8$ is able to be "read" by the differential input indicator DIVI on appropriate switching of S1 as referred to earlier. The fence voltageinput is passed through resistor $R_3$ as referred to earlier, and the earth voltage through opamp OA3.

Opamp OA4 is arranged as a comparator such that it will switch electronic switches 52 and S3 which it controls, when pulses are received, so that the level of the input pulses will be recorded on the storage capacitors $CS_7$ and $CS_8$. When a given fence voltage pulse exceeds a level, established by voltage divider configured resistors $R_6$ and $R_7$, the switches S2 and S3 are enabled by OA4, enabling the voltage levels on the respective storage capacitors $CS_7$ and $CS_8$ to be updated. Resistor $R_8$ is included as shown so that the earth voltage readings are updated even if the fence line is short circuited to earth.

While the switch S1 could comprise any suitable form of switch, in the preferred embodiment the switch is of the manual-capacitance-increase type which is activated by the proximity of the finger of a user placed on a switch plate. This type of switch is employed, with the face place incorporated in the energiser casing, because of its resistance to the elements. A manual switch is likely to suffer from wind and rain with time. The switch face plate is indicated at FPS1. The configuration shown is such that the switch S1 is normally in such a state that the secure earth is input to the indicator DIVI.

Activation of the switch plate FPS1 causes the state of S1 to change, so that the fence voltage will be displayed by the indicator DIVI. The increased capacitance on the switch plate FPS1 causes the output of NAND gate G1 to change, causing a change in the state of JK flip flop FF1, which in turn switches switch S1. Gate G1 has a DC feedback loop composed of resistors $R_{12}$, $R_{13}$ and $R_{14}$ and capacitor $C_9$ so configured that the state of the output of gate G1 is governed by an oscillator comprising NAND gate G2 and resistor and capacitor $R_{15}$ and $C_{11}$ configured as shown. Under normal circumstances the output of gate G1 switches continuously from high to low. The input of G3 is held low. Flip flop (FF1) normally remains in one state. When the switch plate FPS1 is activated, the added capacitance is such that the output of the gate G2 oscillator is no longer able to read the threshold of G1, so its output will go high until its biasing, provided by its DC feedback loop, changes to restablish oscillation at the gate G1. However, the time constant of this DC feedback loop is such that sufficient time is provided for capacitor $C_{12}$ to charge through resistor $R_{16}$ to the threshold level of NAND gate G3 which accordingly changes state, changing the state of NAND gate G and accordingly of flip flop FF1, and switching switch S1. When the gate G1 oscillations resume, capacitor $C_{12}$ is discharged through diode D3 and the circuit attains its original condition, which will not be changed until the switch plate is again activated.

The state of switch S1 and thus the quantity, either fence earth-secure earth voltage or fence voltage, displayed by indicator DIVI is indicated by two LEDs D4 and D5 which are driven directly from flip flop FF2 through resistors $P_{17}$ and $R_{18}$ which is in turn driven by flip flop FF1.

Thus, activating the switch fence plate FPS1 causes switch S1 to change state so that it, for example, the fence earth-secure earth potential difference was being displayed, the fence voltage will be displayed and vice versa. This quantity will continue to be displayed until the switch face plate FPS1 is again activated and the quantity being displayed is indicated by LEDs $D_4$ and $D_5$.

The foregoing describes our invention including a preferred form thereof. The scope of the invention is defined in the following claims.

I claim:

1. An earth testing means for monitoring the status of an earth return system of an electric fence network, said earth testing means being associated with an electric fence energiser, said earth testing means comprising an indicator that indicates the status of the earth return system, said indicator having one input connected by a capacitive coupling to a fence earth terminal connected to a fence earth return system of said energiser, said indicator having another input directly coupled to a secure earth input to the energiser whereby the potential difference between the said earth return system of the electric fence and said secure earth is indicated by said indicator.

2. An earth testing means as claimed in claim 1 wherein the indicator provides a quantitative display of the said potential difference between the said earth return system of the electric fence and the secure earth.

3. An earth testing means as claimed in claim 2 wherein said indicator is a differential input voltage indicator.

4. An earth testing means as claimed in claim 3 wherein said secure earth input is an earth or neutral line of a mains supply connection of the electric fence energiser.

5. An earth testing means as claimed in claim 1, further comprising a peak voltage monitoring means arranged to monitor fluctuations in the potential difference between the said fence earth system and the secure earth and to record increases in the peak level of the potential difference measured.

6. An earth testing means as claimed in claim 1, wherein said earth testing means can be switched to measure the potential difference between the electrified fence line of an electric fence network and the fence earth thereof.

7. An earth testing means as claimed in claim 6 wherein the said indicator is arranged to display the said potential difference between the electrified fence line and the fence earth when the earth testing means is switched therefor.

8. An earth testing means as claimed in claim 7, further comprising a peak voltage monitoring means arranged to monitor fluctuations in the potential difference between said fence line and fence earth and to record increases in the peak level of the potential difference measured.

9. An earth testing means as claimed in claim 6 wherein switching means for switching of the earth testing means comprises an electronic switch, switching of which is controlled by a manual-capacitance-increase switch.

10. An earth testing means as claimed in claim 6 wherein switching means for switching of the earth testing means comprises an electronic switch, switching of which is controlled by way of electrical pulses from an electric fence energiser in which the earth testing means is incorporated.

11. An earth testing means as claimed in claim 1, wherein said earth testing means is incorporated into an electric fence energiser.

* * * * *